United States Patent
Fujii

[19]

[11] Patent Number: 5,963,062
[45] Date of Patent: Oct. 5, 1999

[54] WINDOW COMPARATOR

[75] Inventor: Tomohiro Fujii, Tokyo, Japan

[73] Assignee: NEC Corporation, Tokyo, Japan

[21] Appl. No.: 08/953,587

[22] Filed: Oct. 17, 1997

[30] Foreign Application Priority Data

Oct. 18, 1996  [JP]  Japan ................................. 8-297598

[51] Int. Cl.⁶ ........................................... H03K 5/153
[52] U.S. Cl. ............................ 327/74; 327/77; 327/89
[58] Field of Search ............................ 327/77, 103, 65,
327/66, 52, 53, 68, 74, 205, 206, 88, 89;
330/257, 252; 323/315, 316

[56] References Cited

U.S. PATENT DOCUMENTS

| | | | |
|---|---|---|---|
| 4,047,059 | 9/1977 | Rosenthal | 327/66 |
| 4,185,212 | 1/1980 | Leidich | 327/77 |
| 4,300,063 | 11/1981 | Dunphy et al. | 307/355 |
| 4,409,497 | 10/1983 | Nagano | 307/360 |
| 4,529,891 | 7/1985 | Oida | 327/77 |
| 4,871,979 | 10/1989 | Shearer et al. | 330/257 |
| 5,066,876 | 11/1991 | Fukuda et al. | 3323/315 |

FOREIGN PATENT DOCUMENTS 1 570 924  7/1980  United Kingdom .

*Primary Examiner*—Toan Tran
*Attorney, Agent, or Firm*—Scully, Scott, Murphy & Presser

[57] ABSTRACT

A window comparator includes a differential circuit stage and a load circuit stage. The differential circuit stage produces a pair of differential currents from an input voltage, the differential currents varying depending on the input voltage with having a maximum and a minimum when the input voltage is a reference voltage. The load circuit stage produces an output voltage from a reference current and a current corresponding to a selected on of the differential currents. The reference current and the current are produced such that a voltage range is determined around the predetermined voltage depending on whether the second current is greater than the reference current. Since a window of the window comparator is formed based on the current and the reference current, the output voltage changes in level depending on whether the input voltage falls into the voltage range.

16 Claims, 14 Drawing Sheets

WINDOW COMPARATOR

BACKGROUND OF THE INVENTION

1. Field of the Invention

The present invention generally relates to a semiconductor integrated circuit, and in particular to a window comparator circuit suitable for the semiconductor integrated circuit.

2. Description of the Related Art

A window comparator outputs a different voltage signal depending on whether an input voltage falls into a predetermined voltage range (hereinafter referred to as a window). In general, such a window comparator includes two operational amplifiers to produce a window. More specifically, a first operational amplifier compares the input voltage with a first reference voltage and a second operational amplifier compares the output of the first operational amplifier with a second reference voltage.

However, the conventional window comparator is not suitable for a semiconductor integrated circuit. In other words, it is hard to form the conventional circuit arrangement of a window comparator on a semiconductor substrate using a bipolar process.

SUMMARY OF THE INVENTION

An object of the present invention is to provide a window comparator which is suitable for a semiconductor integrated circuit formed on a semiconductor substrate by using a bipolar process.

Another object of the present invention is to provide a window formation method which is capable of forming a window of a window comparator.

A circuit of a window comparator according to the present invention includes a first circuit stage and a second circuit stage. The first circuit stage produces a first current from an input voltage, the first current varying depending on the input voltage such that the first current has one of a maximum and a minimum when the input voltage is a predetermined voltage. The second circuit stage produces an output voltage from a reference current and a second current corresponding to the first current. The reference current and the second current are produced such that a voltage range is determined around the predetermined voltage depending on whether the second current is greater than the reference current. In other words, the window of the window comparator is formed based on the second current and the reference current. Therefore, the output voltage changes in level depending on whether the input voltage falls into the voltage range.

DETAILED DESCRIPTION OF THE PREFERRED EMBODIMENTS

FIRST EMBODIMENT

Figure 1:
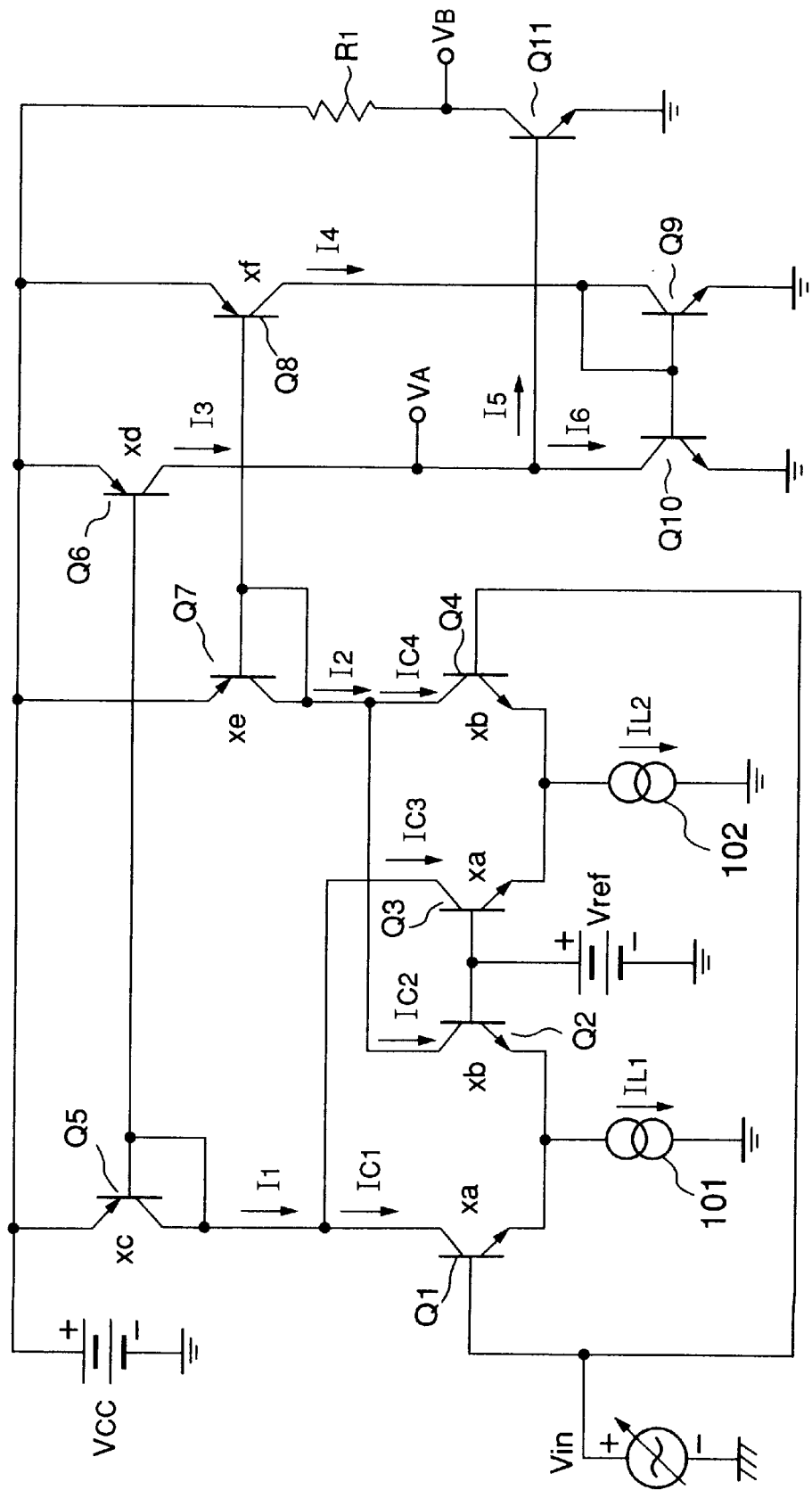
FIG. 1 is a circuit diagram showing a first embodiment according to the present invention.

Referring to FIG. 1, a window comparator is composed of an input differential stage including NPN transistors Q1–Q4 and a load circuit including PNP transistors Q5–Q8 and NPN transistors Q9–Q11. The input differential stage inputs an input voltage Vin and produces output currents $I_1$ and $I_2$. The load circuit produces an output voltage $V_A$ and an inverted output voltage $V_B$ from the output currents $I_1$ and $I_2$ of the input differential stage.

The input differential stage is composed of a first differential pair circuit having the transistors Q1 and Q2 whose emitters are connected in common to a constant current source 101 (constant current $I_{L1}$) and a second differential pair circuit having the transistors Q3 and Q4 whose emitters are connected in common to a constant current source 102 (constant current $I_{L2}$). The bases of the transistors Q2 and Q3 are interconnected and a reference voltage Vref is applied thereto and the input voltage Vin is applied to the bases of the transistors Q1 and Q4 which are interconnected. Further, the collectors of the transistors Q1 and Q3 are interconnected and the collectors of the transistors Q2 and Q4 are interconnected.

In the first differential pair circuit, the emitter area $S_{E1}$ of the transistor Q1 is different from the emitter area $S_{E2}$ of the transistor Q2. Similarly, in the second differential pair circuit, the emitter area $S_{E3}$ of the transistor Q3 is different from the emitter area $S_{E4}$ of the transistor Q4. Here, $S_{E1}:S_{E2}=S_{E3}:S_{E4}=a:b$ (a≠b).

The load circuit is composed of three current mirror circuits and an inverter circuit. More specifically, a first current mirror circuit is composed of the transistors Q5 and Q6. The base and collector of the transistor Q5 are interconnected and further connected to the collectors of the transistors Q1 and Q3 of the input differential stage. The bases of the transistors Q5 and Q6 are interconnected and a power supply voltage Vcc is applied to the emitters thereof.

Therefore, the transistor Q5 cooperates with the transistor Q6 to form the first current mirror circuit. Similarly, a second current mirror circuit is composed of the transistors Q7 and Q8. The base and collector of the transistor Q7 are interconnected and further connected to the collectors of the transistors Q2 and Q4 of the input differential stage. The bases of the transistors Q7 and Q8 are interconnected and the power supply voltage Vcc is applied to the emitters thereof. Therefore, the transistor Q7 cooperates with the transistor Q8 to form the second current mirror circuit.

In the first current mirror circuit, the emitter area $S_{E5}$ of the transistor Q5 is different from the emitter area $S_{E6}$ of the transistor Q6. Here, $S_{E5}:S_{E6}$=c:d (c≠d). Similarly, in the second current mirror circuit, the emitter area $S_{E7}$ of the transistor Q7 is different from the emitter area $S_{E8}$ of the transistor Q8. Here, $S_{E7}:S_{E8}$=e:f (e≠f).

A third current mirror circuit is composed of the transistors Q9 and Q10. The base and collector of the transistor Q9 are interconnected and further connected to the collector of the transistor Q8 of the second current mirror circuit. The collector of the transistor Q10 is connected to the collector of the transistor Q6 of the first current mirror circuit. The bases of the transistors Q9 and Q10 are interconnected and their emitters are grounded. The emitter area of the transistor Q9 is equal to that of the transistor Q10. The output voltage $V_A$ appears on a connection point of the collectors of the transistors Q6 and Q10.

The inverter circuit is composed of the transistor Q11 and a resistor R1. The base of the transistor Q11 is connected to the connection point of the collectors of the transistors Q6 and Q10. The emitter of the transistor Q11 is grounded and the collector thereof is connected to the power supply voltage Vcc through the resistor R1. The inverted output voltage $V_B$ appears on the collector of the transistor Q11.

INPUT DIFFERENTIAL STAGE

Figure 2:
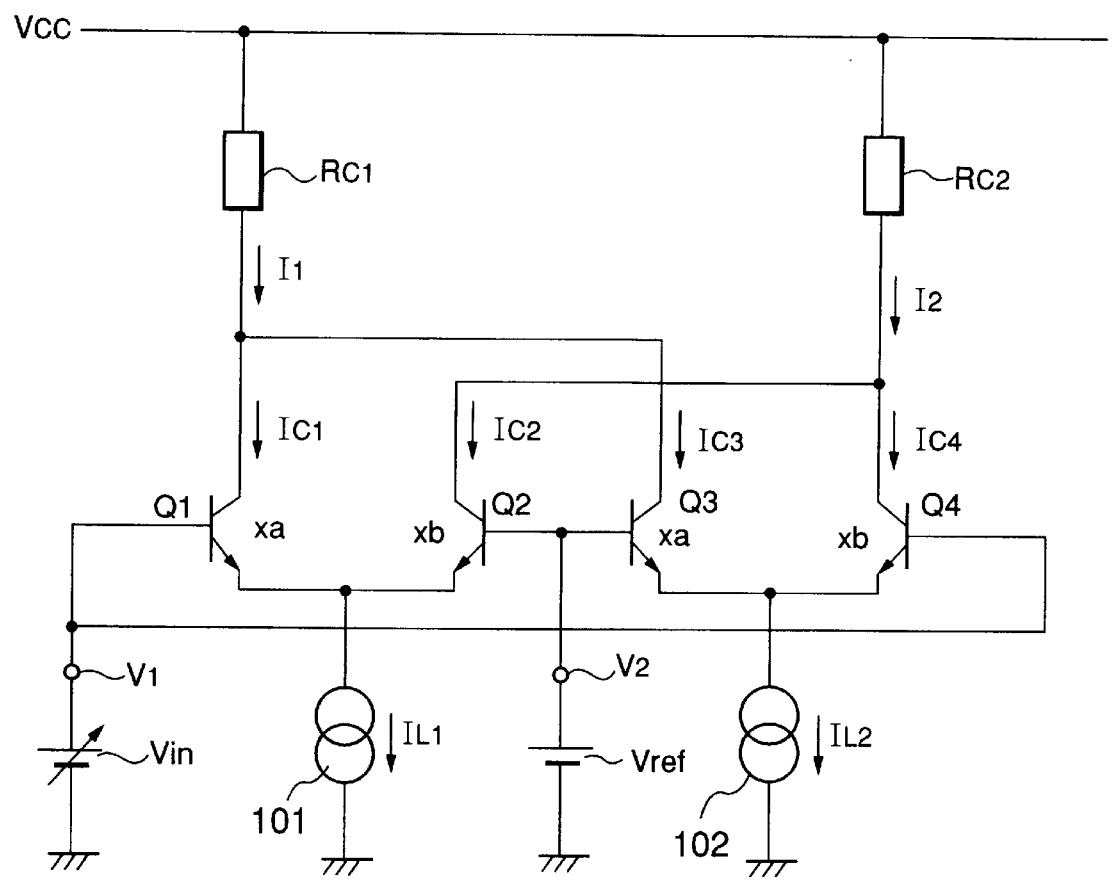
FIG. 2 is a circuit diagram showing an input differential stage of the first embodiment as shown in FIG. 1.

Referring to FIG. 2, there is shown the input differential stage in the window comparator of FIG. 1. In this figure, the load circuit is denoted by $R_{C1}$ and $R_{C2}$. First and second loads $R_{C1}$ and $R_{C2}$ are connected to first and second output points of the input differential stage, that is, the collectors of the transistors Q1 and Q3 and the collectors of the transistors Q2 and Q4, respectively. The output currents $I_1$ and $I_2$ of the input differential stage flow through the first and second loads $R_{C1}$ and $R_{C2}$, respectively. Further, the collector currents of the transistors Q1–Q4 are denoted by $I_{C1}$–$I_{C4}$, respectively, and, as described before, the respective emitter area ratios of the differential pair circuits are both a/b. In such an input differential stage, the collector currents $I_{C1}$–$I_{C4}$ of the transistors Q1–Q4 are, as known well, represented by the following equations (1) to (4):

$$I_{C1} = \frac{\beta}{\beta+1} \cdot \frac{I_{L1}}{1+\exp\{(-q/KT)\times(V1+dV-V2)\}}, \quad (1)$$

$$I_{C2} = \frac{\beta}{\beta+1} \cdot \frac{I_{L1}}{1+\exp\{(q/KT)\times(V1+dV-V2)\}}, \quad (2)$$

$$I_{C3} = \frac{\beta}{\beta+1} \cdot \frac{I_{L2}}{1+\exp\{(q/KT)\times(V1-dV-V2)\}}, \quad (3)$$

and $$I_{C4} = \frac{\beta}{\beta+1} \cdot \frac{I_{L2}}{1+\exp\{(-q/KT)\times(V1+dV-V2)\}}, \quad (4)$$

wherein K is Boltzmann's constant, T is the absolute temperature, q is the charge of an electron, β is a current amplification factor, V1 is the input voltage Vin, and V2 is the reference voltage Vref. Further, dV is represented as follows:

$$dV=(KT/q)\times ln(a/b) \quad (5),$$

wherein ln indicates the natural logarithm. Therefore, when a/b≠1, the characteristic curves of the collector currents $I_{C1}$ and $I_{C2}$ and those of the collector currents $I_{C3}$ and $I_{C4}$ are shifted away from the reference voltage Vref by dV in opposite directions.

Figure 3:
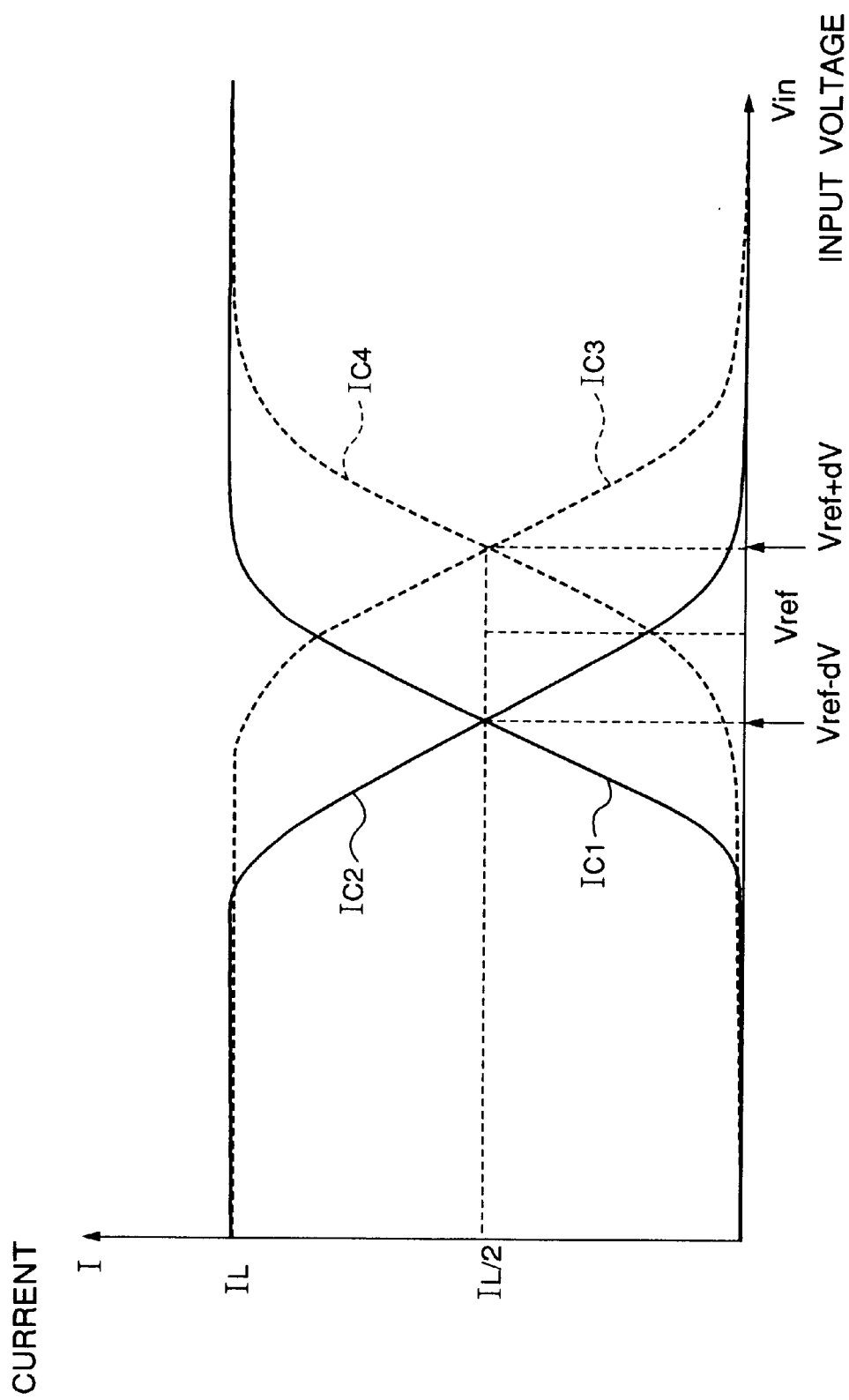
FIG. 3 is a diagram showing how the respective currents $I_{c1}$–$I_{c4}$ vary with an input voltage Vin in the input differential stage of FIG. 2.
Figure 4:
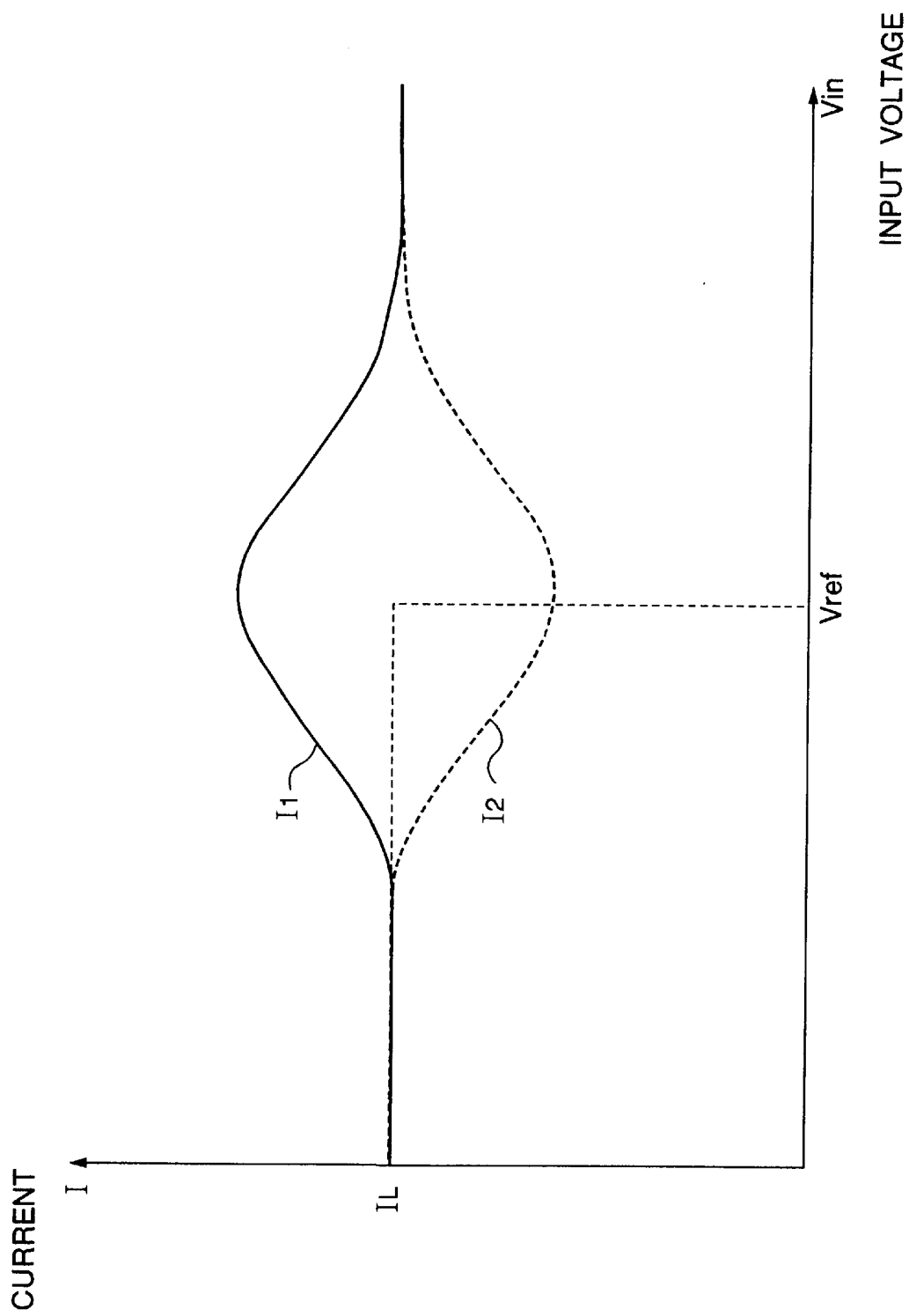
FIG. 4 is a diagram showing how the respective output currents $I_1$ and $I_2$ vary with the input voltage Vin in the input differential stage of FIG. 2.

Referring to FIGS. 3 and 4, the current characteristic curves are shown in the case of $I_{L1}=I_{L2}=I_L$. As shown in FIG. 3, the respective collector currents $I_{C1}$–$I_{C4}$ of the transistors Q1–Q4 vary according to the input voltage Vin. Since the respective emitter area ratios of the differential pair circuits are a/b≠1, the characteristic curves of the collector currents $I_{C1}$ and $I_{C2}$ and those of the collector currents $I_{C3}$ and $I_{C4}$ are symmetric with respect to a vertical line indicating the reference voltage Vref as shown in the figure. Since $I_1=I_{C1}+I_{C3}$ and $I_2=I_{C2}+I_{C4}$, the characteristic curves of $I_1$ and $I_2$ are symmetric with respect to a horizontal line indicating the constant current $I_L$ as shown in FIG. 4.

LOAD CIRCUIT

Figure 5:
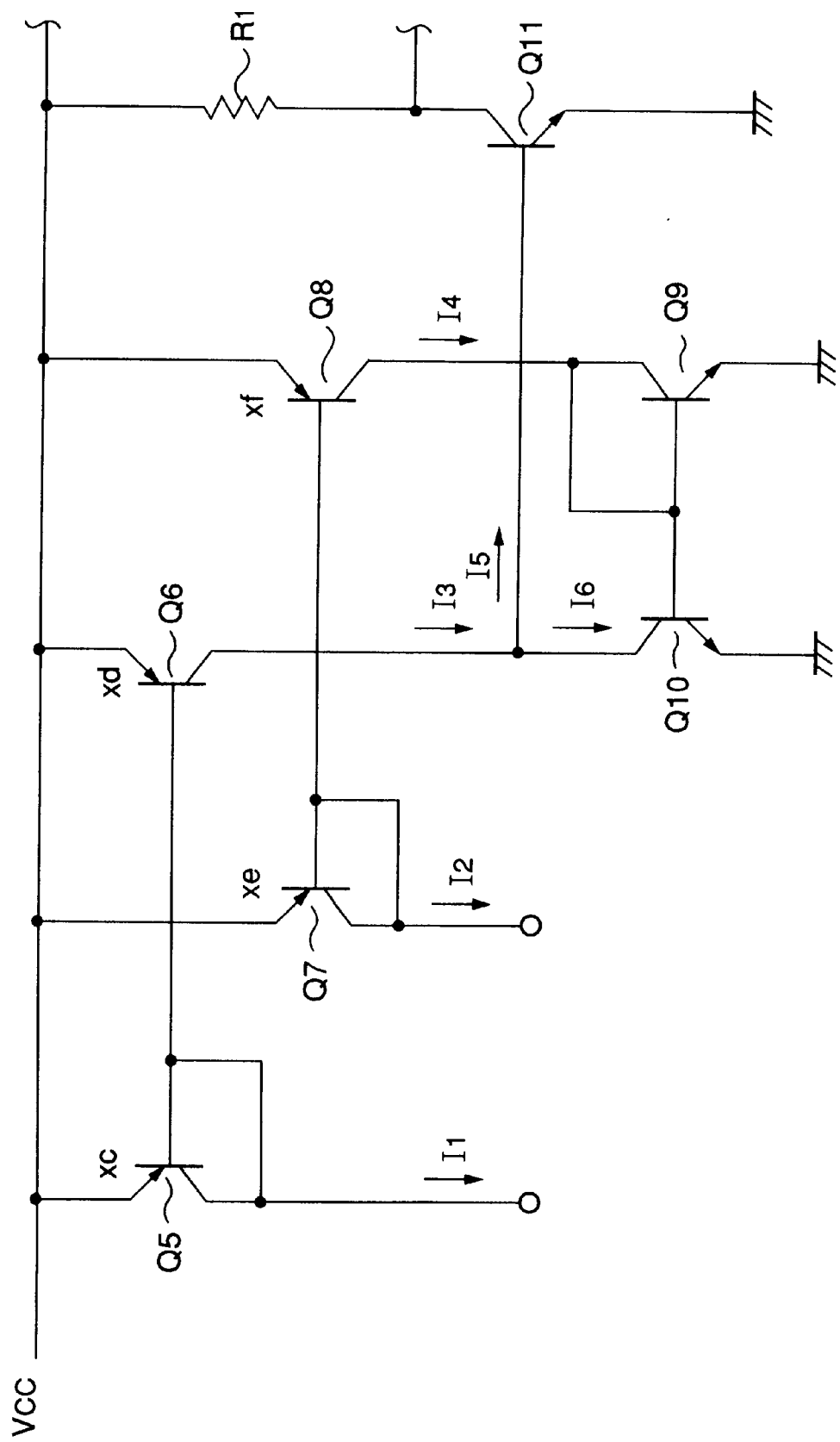
FIG. 5 is a circuit diagram showing a load circuit of the first embodiment as shown in FIG. 1.

Referring to FIG. 5, there is shown the load circuit of the window comparator of FIG. 1, corresponding to $R_{C1}$ and $R_{C2}$ of FIG. 2. As described above, the transistors Q5 and Q6 having a first emitter area ratio (c:d) constitute the first current mirror circuit, the transistors Q7 and Q8 having a second emitter area ratio (e:f) constitute the second current mirror circuit, and the transistors Q9 and Q10 having the equal emitter area constitute the third current mirror circuit. When the respective collector currents of the transistors Q6 and Q8 are denoted by $I_3$ and $I_4$, the base current of the transistor Q11 by $I_5$, and the collector current of the transistor Q10 by $I_6$, the collector current $I_3$ is represented by $d/c \times I_1$ and the collector current $I_4$ is represented by $f/e \times I_2$. Further, the collector current $I_6$ is substantially equal to $I_4$ because the transistors Q9 and Q10 have the equal emitter area and therefore the base current is negligible.

Figure 6:
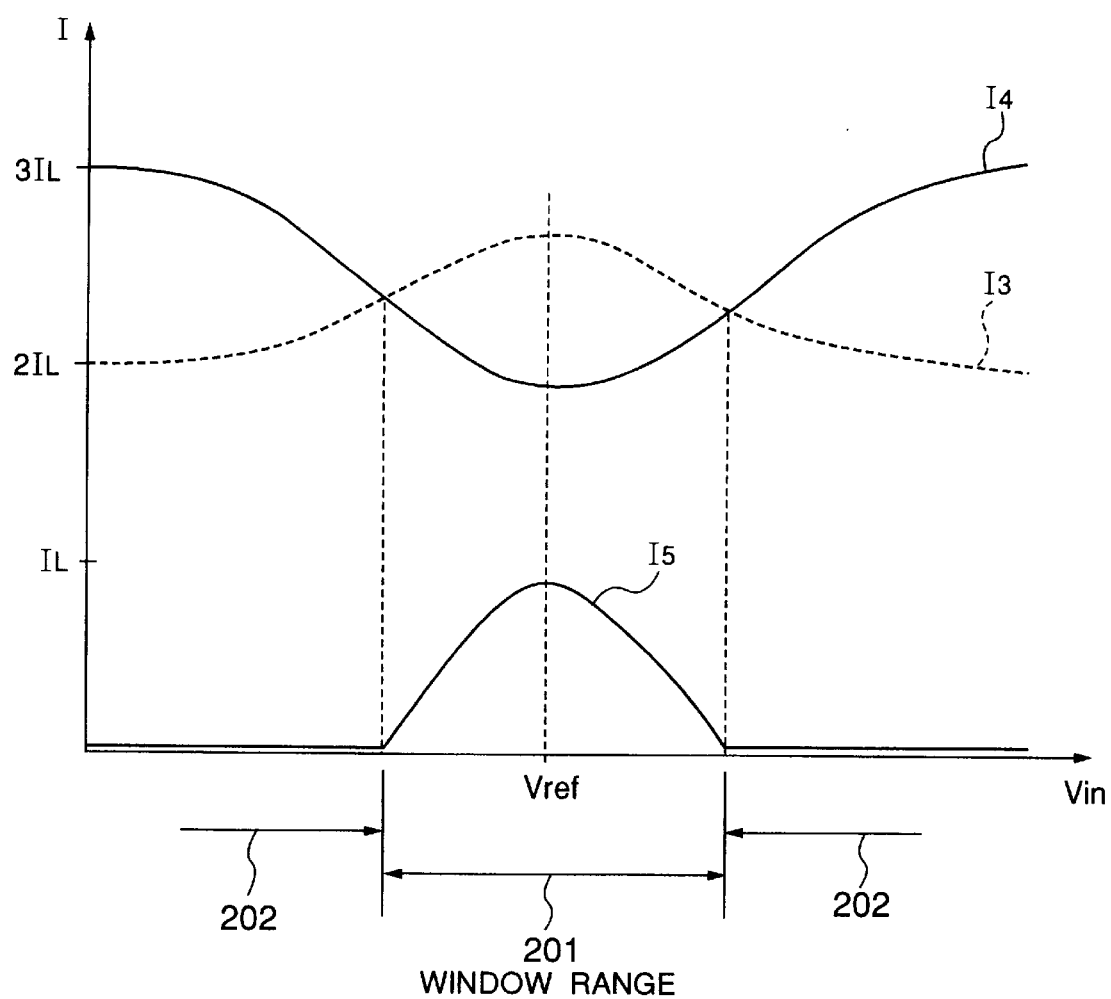
FIG. 6 is a diagram showing how the respective currents $I_3$–$I_5$ vary with the input voltage Vin in the load circuit of FIG. 5.

Referring to FIG. 6, the current characteristic curves of the load circuit are shown in the case where c:d=1:2 and e:f=1:3. More specifically, the collector current $I_3$ is represented by $2I_1$ and the collector current $I_4$ is represented by $3I_2$. By setting the emitter area ratios like these, a window range 201 where $I_3 \geq I_4$ and other ranges 202 where $I_3 < I_4$ are generated from a pair of differential output currents $I_1$ and $I_2$ of FIG. 4. The window range 201 where $I_3 \geq I_4$ has a center voltage of Vref with a deviation determined by the emitter area ratios d/c and f/e. In other words, the emitter area ratios d/c and f/e may be set so that a desired window range 201 can be generated.

In the outside ranges 202 where $I_3 < I_4$, all the collector current $I_3$ of the transistor Q6 flows into the collector of the transistor Q10, resulting in $I_3=I_6$. Therefore, the base current $I_5$ of the transistor Q11 is equal to zero when the input voltage Vin falls into the outside ranges 202. On the other hand, in the window range 201 where $I_3 \geq I_4$, the extra current of the collector current $I_3$ flows as the base current $I_5$ into the base of the transistor Q11. That is, $I_5=I_3-I_6$.

In this manner, the base current $I_5$ of the transistor Q11 flows only when the input voltage Vin falls into the window range 201. In other words, with a cut-off point of $I_3=I_4$, the transistor Q11 is kept off or non-conductive during the outside range 202 and becomes on or conductive during the window range 201. Therefore, a sharp comparator window can be obtained as shown in FIGS. 7 and 8.

Figure 7:
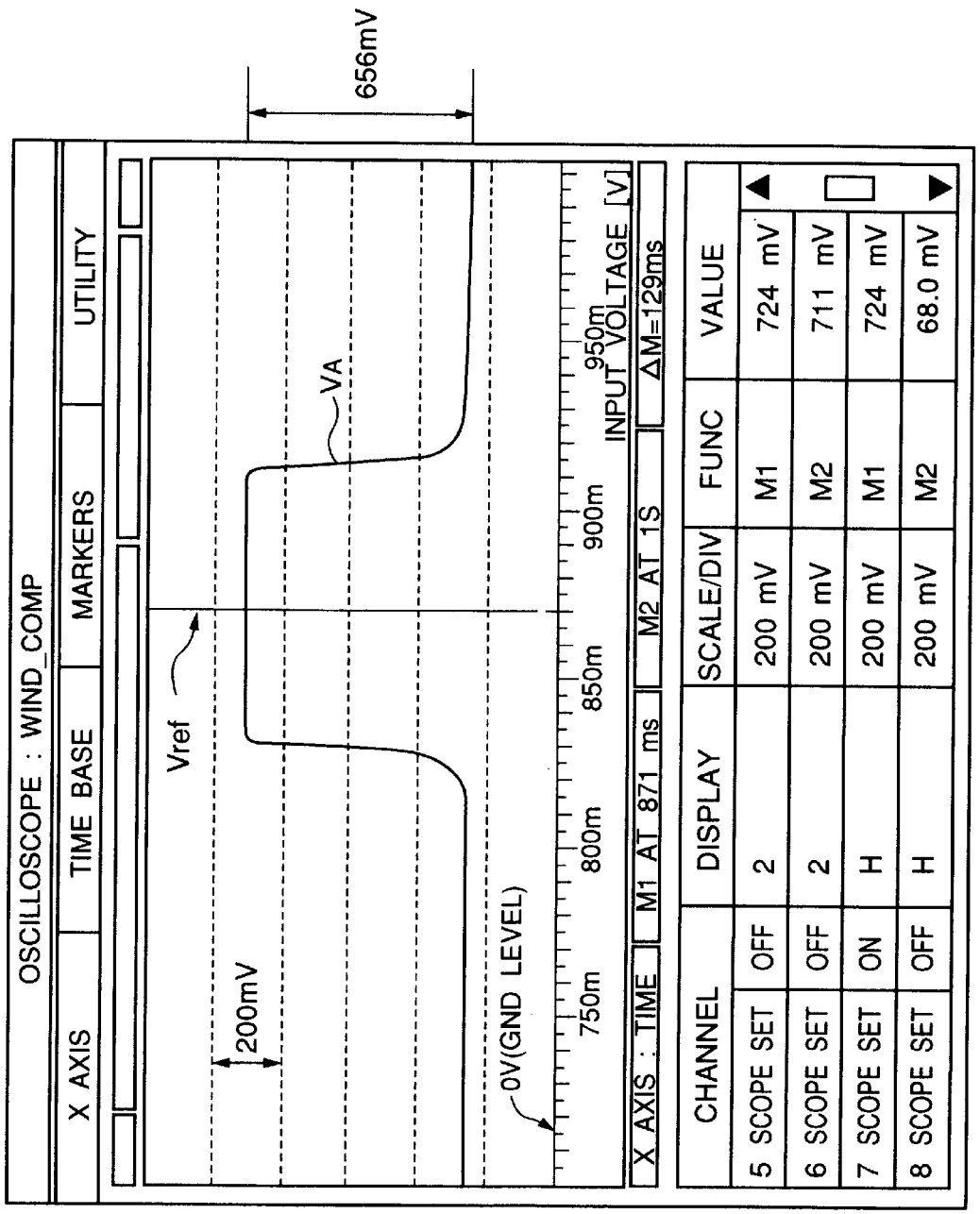
FIG. 7 is a diagram showing how an output voltage $V_A$ varies with the input voltage Vin in the first embodiment of FIG. 1.
Figure 8:
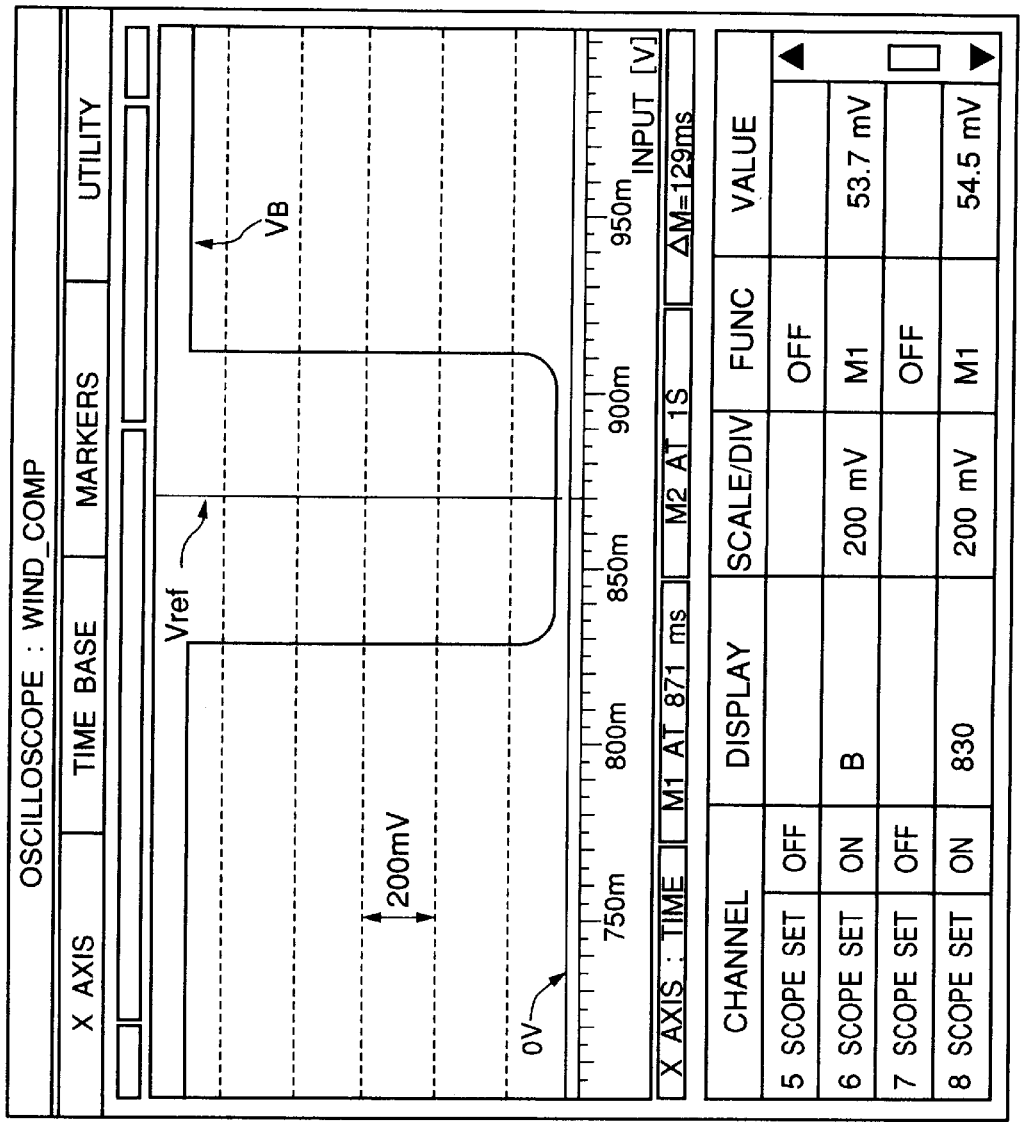
FIG. 8 is a diagram showing how an inverted output voltage $V_B$ varies with the input voltage Vin in the first embodiment of FIG. 1.

FIGS. 7 and 8 show an input-output response of the embodiment in circuit-simulation on condition that a:b=2:1, c:d=1:2, e:f=1:3, $I_{L1}=I_{L2}=I_L=5$ μA, Vref=0.87 V, Vcc=1.05 V, the resistor R1=100 KΩ. It is apparent from the figures that the output voltage $V_A$ and the inverted output voltage $V_B$ sharply change at the edges of the window range 201 to produce a sharp comparator window.

SECOND EMBODIMENT

Figure 9:
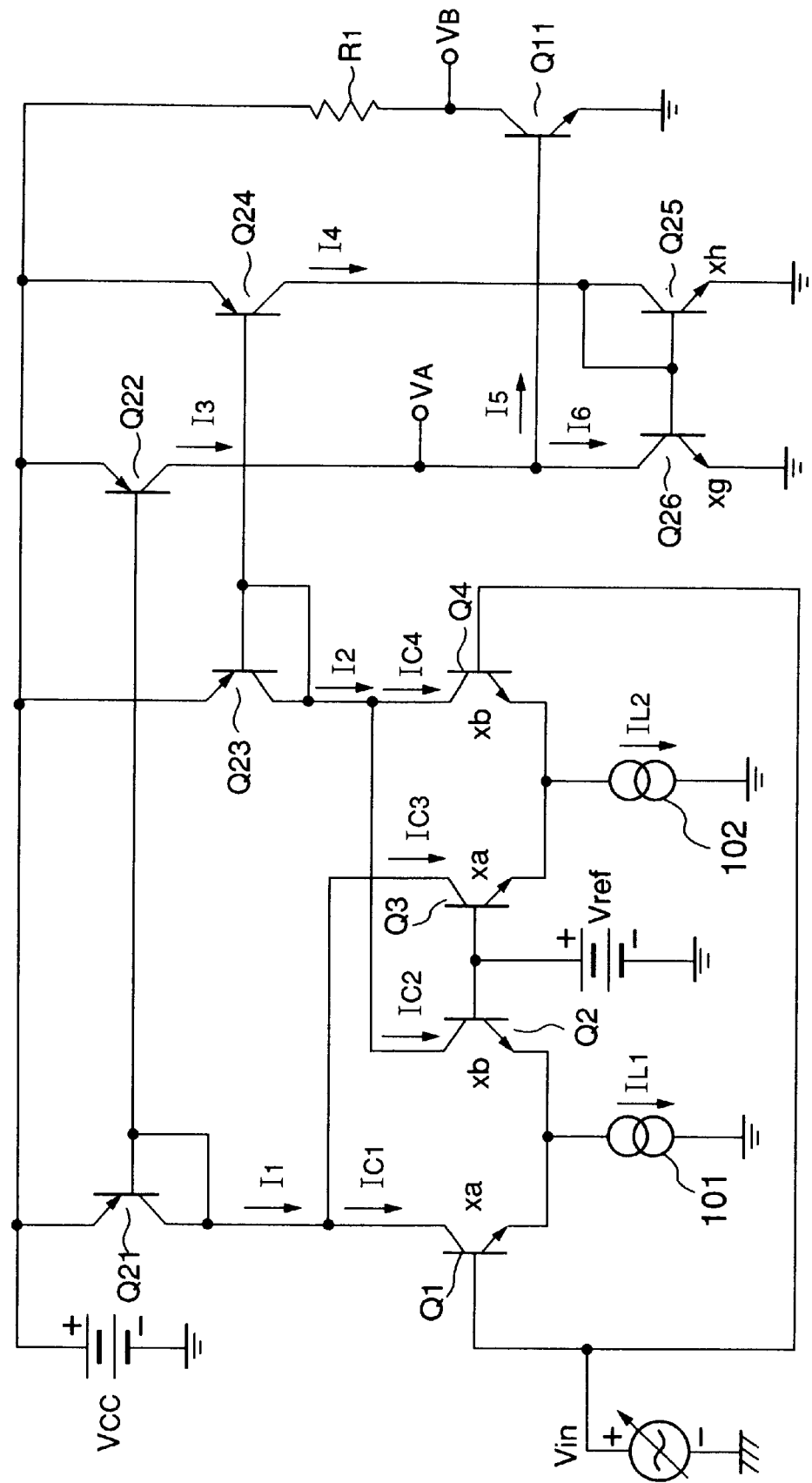
FIG. 9 is a circuit diagram showing a second embodiment according to the present invention.

Referring to FIG. 9, a window comparator according to a second embodiment of the present invention has the same input differential stage as the first embodiment of FIG. 1. Therefore, the characteristic curves of the output currents $I_1$ and $I_2$ are shown in FIG. 4, as in the case of the first embodiment. In the second embodiment, however, the load circuit is different from the first embodiment as will be described hereinafter.

As shown in FIG. 9, the load circuit is composed of three current mirror circuits and an inverter circuit. More specifically, a first current mirror circuit is composed of the transistors Q21 and Q22. The base and collector of the transistor Q21 are interconnected and further connected to the collectors of the transistors Q1 and Q3 of the input differential stage. The bases of the transistors Q21 and Q22 are interconnected and a power supply voltage Vcc is applied to the emitters thereof. Therefore, the transistor Q21 cooperates with the transistor Q22 to form the first current mirror circuit. Similarly, a second current mirror circuit is composed of the transistors Q23 and Q24. The base and collector of the transistor Q23 are interconnected and further connected to the collectors of the transistors Q2 and Q4 of the input differential stage. The bases of the transistors Q23 and Q24 are interconnected and the power supply voltage Vcc is applied to the emitters thereof. Therefore, the transistor Q23 cooperates with the transistor Q24 to form the second current mirror circuit. In the second embodiment, the emitter area of the transistor Q21 is equal to that of the transistor Q22, that is, c:d=1:1. Similarly, the emitter area of the transistor Q23 is equal to that of the transistor Q24, that is, e:f=1:1.

A third current mirror circuit is composed of the transistors Q25 and Q26. The base and collector of the transistor Q25 are interconnected and further connected to the collector of the transistor Q24 of the second current mirror circuit. The collector of the transistor Q26 is connected to the collector of the transistor Q22 of the first current mirror circuit. The bases of the transistors Q25 and Q26 are interconnected and their emitters are grounded. The emitter area $SE_{25}$ of the transistor Q25 is different from the emitter area $SE_{26}$ of the transistor Q26. Here, $SE_{25}:SE_{26}$=h:g. The output voltage $V_A$ appears on a connection point of the collectors of the transistors Q22 and Q26.

The inverter circuit is composed of the transistor Q11 and the resistor R1 as in the case of the first embodiment. The inverted output voltage $V_B$ appears on the collector of the transistor Q11.

The transistors Q21 and Q22 having the equal emitter area constitute the first current mirror circuit, the transistors Q23 and Q24 having the equal emitter area constitute the second current mirror circuit, and the transistors Q25 and Q26 having different emitter areas (area ratio is h:g) constitute the third current mirror circuit. When the respective collector currents of the transistors Q22 and Q24 are denoted by $I_3$ and $I_4$, the base current of the transistor Q11 by $I_5$, and the collector current of the transistor Q26 by $I_6$, the collector current $I_3$ is substantially equal to $I_1$ and the collector current $I_4$ is substantially equal to $I_2$. Further, the collector current $I_6$ is represented by $g/h \times I_4$ because the base current is negligible.

Figure 10:
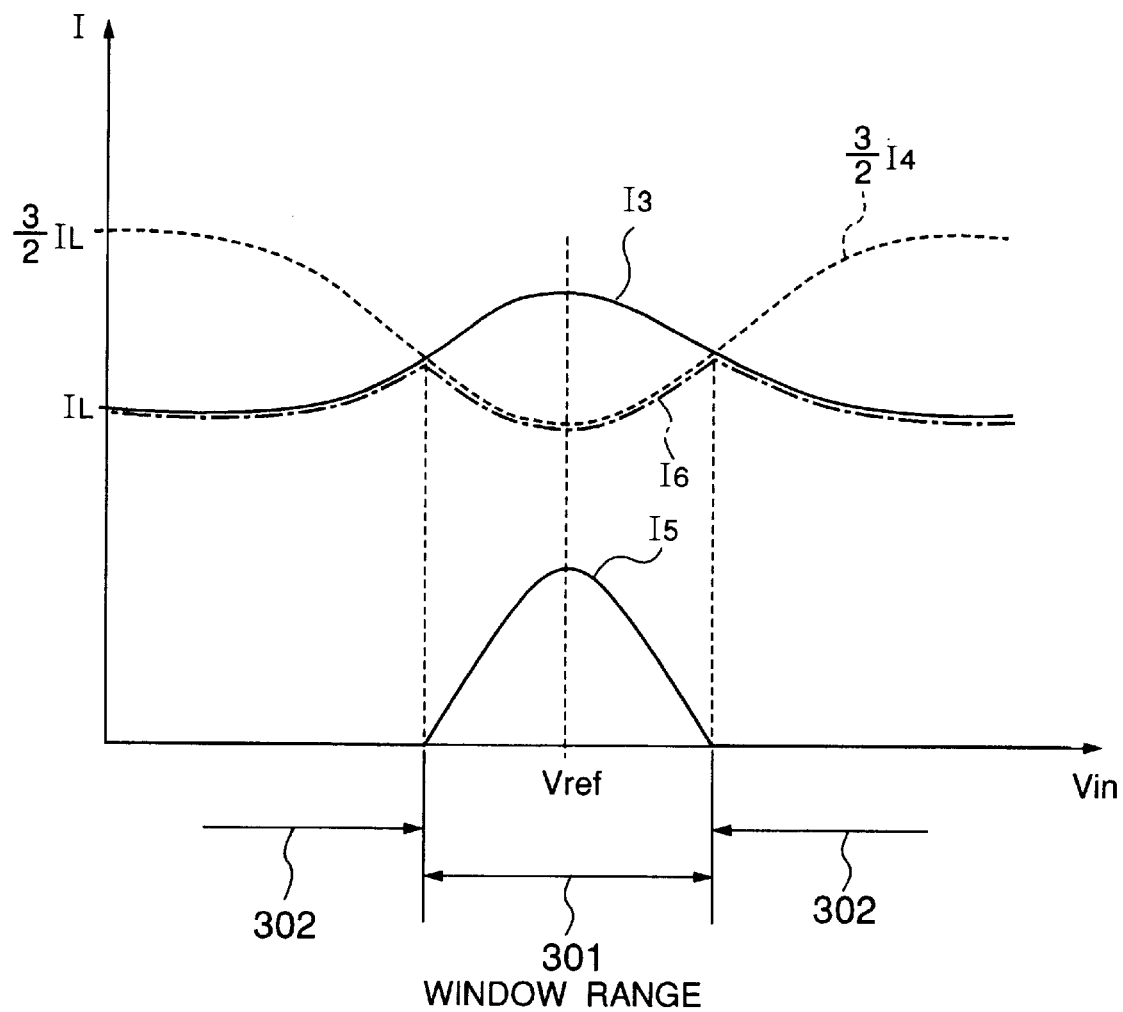
FIG. 10 is a diagram showing how the respective currents $I_3$–$I_6$ vary with the input voltage Vin in a load circuit of the second embodiment as shown in FIG. 9.

Referring to FIG. 10, the current characteristic curves of the load circuit are shown in the case where h:g=2:3. More specifically, the collector current $I_6$ is represented by $3/2 \times I_4$. By setting the emitter area ratio like this, a window range 301 where $I_3 \geq I_6$ (=$3/2 \times I_4$) and other ranges 302 where $I_3 < I_6$ (=$3/2 \times I_4$) are generated from a pair of differential output currents $I_1$ and $I_2$ of FIG. 4. The window range 301 has a center voltage of Vref with a deviation determined by the emitter area ratios g/h. In other words, the emitter area ratios g/h may be set so that a desired window range 301 can be generated.

In the outside ranges 302 where $I_3 < I_6$, all the collector current $I_3$ of the transistor Q22 flows into the collector of the transistor Q26, resulting in $I_3 = I_6$. Therefore, the base current $I_5$ of the transistor Q11 is equal to zero when the input voltage Vin falls into the outside ranges 302. On the other hand, in the window range 301 where $I_3 \geq I_6$, the extra current of the collector current $I_3$ flows as the base current $I_5$ into the base of the transistor Q11. That is, $I_5 = I_3 - I_6$.

In this manner, the base current $I_5$ of the transistor Q11 flows only when the input voltage Vin falls into the window range 301. In other words, with a cut-off point of $I_3 = I_6$, the transistor Q11 is kept off or non-conductive during the outside range 302 and becomes on or conductive during the window range 301. Therefore, a sharp comparator window can be obtained as shown in FIG. 11.

Figure 11:
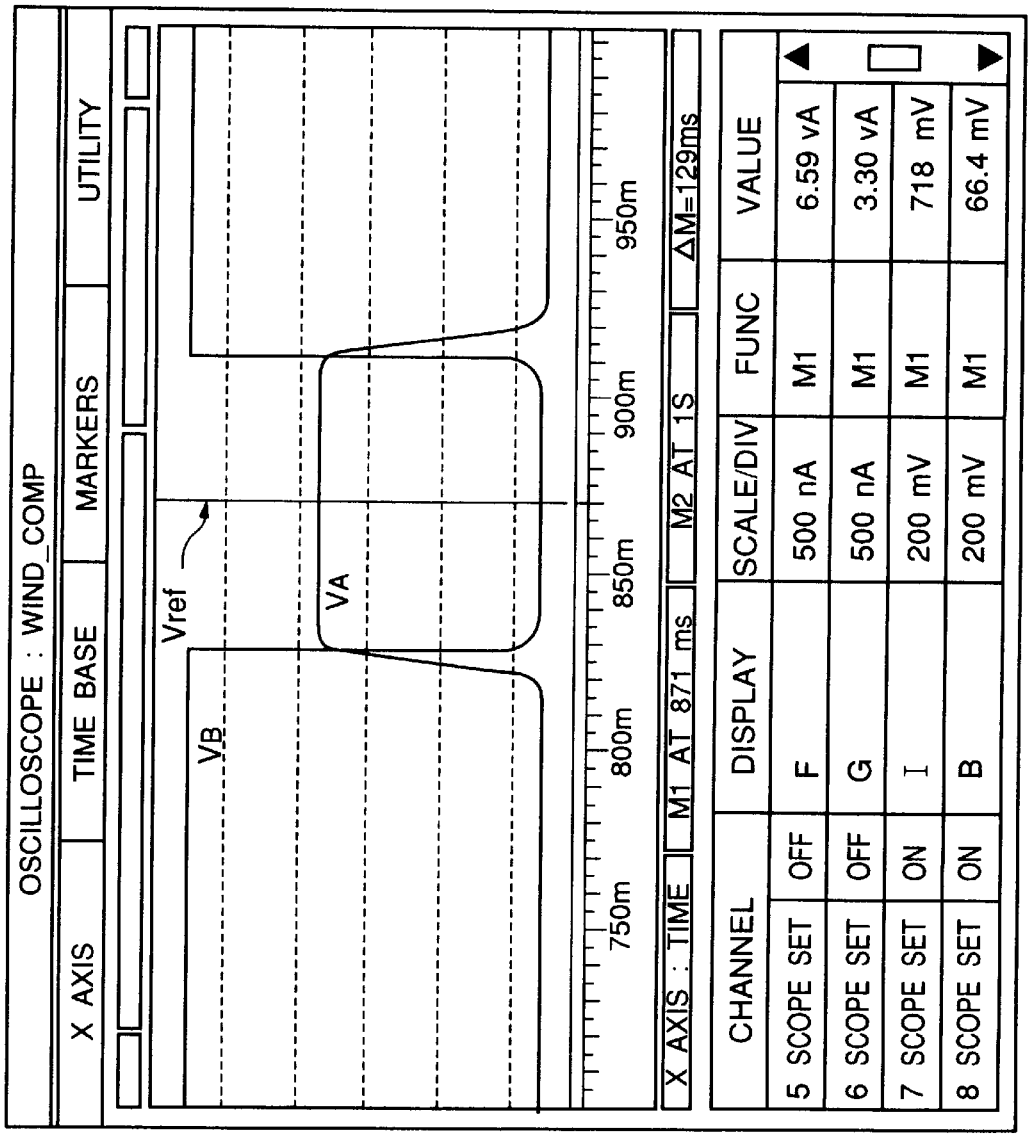
FIG. 11 is a diagram showing how the output voltages $V_A$ and $V_B$ vary with the input voltage Vin in the second embodiment of FIG. 9.

FIG. 11 shows an input-output response of the embodiment in circuit simulation on condition that a:b=2:1, h:g=2:3, $I_{L1}=I_{L2}=I_L=5$ μA, Vref=0.87 V, Vcc=1.05 V, the resistor R1=100 KΩ. It is apparent from the figure that the output voltage $V_A$ and the inverted output voltage $V_B$ sharply change at the edges of the window range 301 to produce a sharp comparator window.

THIRD EMBODIMENT

Figure 12:
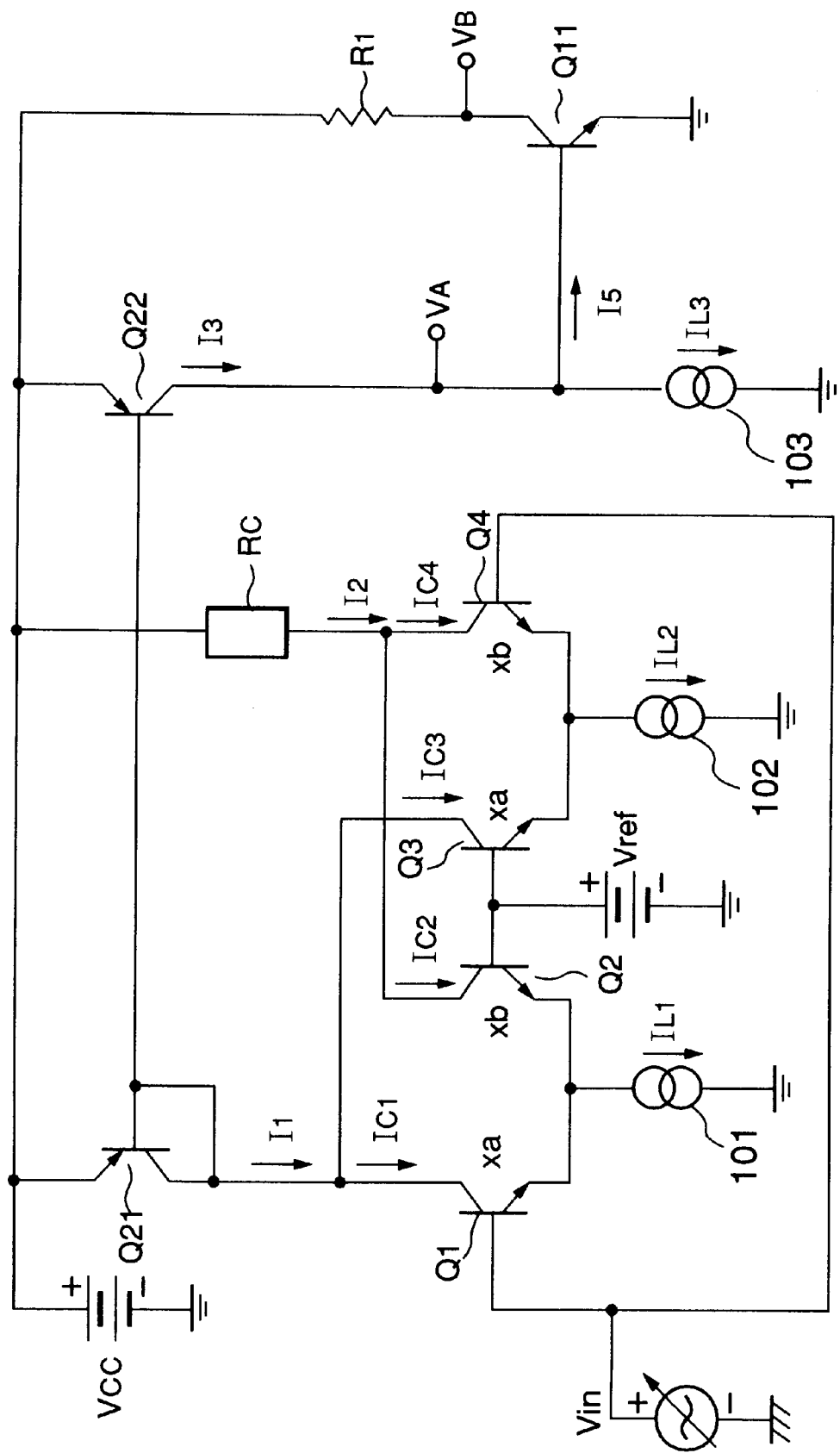
FIG. 12 is a circuit diagram showing a third embodiment according to the present invention.

Referring to FIG. 12, a window comparator according to a third embodiment of the present invention has the same input diferential stage as the first embodiment of FIG. 1. Therefore, the characteristic curves of the output currents $I_1$ and $I_2$ are shown in FIG. 4, as in the case of the first embodiment. In the third embodiment, however, the load circuit is different from the first embodiment as will be described hereinafter.

As shown in FIG. 12, the load circuit is composed of a current mirror circuit composed of the transistors Q21 and Q22, a load Rc, a constant current source 103 and an inverter circuit composed of the transistor Q11. More specifically, the base and collector of the transistor Q21 are interconnected and further connected to the collectors of the transistors Q1 and Q3 of the input differential stage. The bases of the transistors Q21 and Q22 are interconnected and a power supply voltage Vcc is applied to the emitters thereof. Therefore, the transistor Q21 cooperates with the transistor Q22 to form the current mirror circuit. In the third embodiment, the emitter area of the transistor Q21 is equal to that of the transistor Q22, that is, c:d=1:1. The collector of the transistor Q22 is grounded through the constant current source 103. The output voltage $V_A$ appears on the collector of the transistor Q22. The inverter circuit is composed of the transistor Q11 and the resistor R1 as in the case of the first embodiment. The inverted output voltage $V_B$ appears on the collector of the transistor Q11. On the other hand, the collectors of the transistors Q2 and Q4 of the input differential stage is connected to the power supply Vcc through the load Rc.

Hereinafter, the collector current of the transistor Q22 is denoted by $I_3$, the base current of the transistor Q11 by $I_5$ and the constant current of the constant current source 103 by $I_{L3}$.

Figure 13:
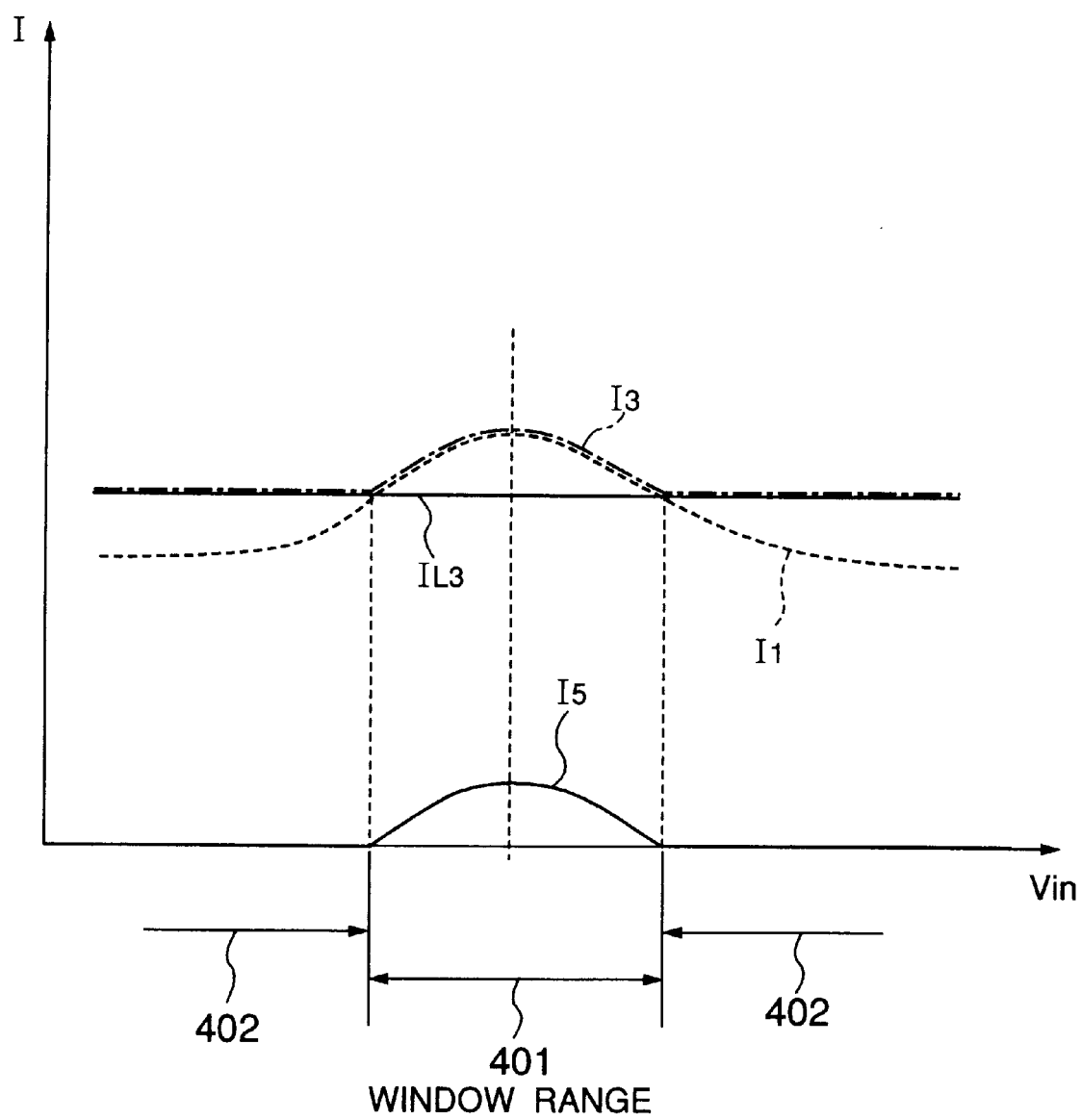
FIG. 13 is a diagram showing how the respective currents vary with the input voltage Vin in a load circuit of the third embodiment as shown in FIG. 12.

Referring to FIG. 13, the collector current $I_3$ is substantially equal to $I_1$ because the emitter area of the transistor Q21 is equal to that of the transistor Q22 and the constant current $I_{L3}$ of the constant current source 103 is set so that a horizontal line indicating the constant current $I_{L3}$ cuts the curve of the collector current $I_3$ or $I_1$ as shown in this figure. Therefore, a window range 401 where $I_3 \geq I_{L3}$ and other ranges 402 where $I_3 < I_{L3}$ are generated from the output current $I_1$ of FIG. 4. The window range 401 has a center voltage of Vref with a deviation determined by the constant current $I_{L3}$.

In the outside ranges 402 where $I_3 < I_{L3}$, all the collector current $I_3$ of the transistor Q22 flows into the constant current source 103, resulting in $I_3 = I_{L3}$. Therefore, the base current $I_5$ of the transistor Q11 is equal to zero when the input voltage Vin falls into the outside ranges 402. On the other hand, in the window range 401 where $I_3 \geq I_{L3}$, the extra current of the collector current $I_3$ flows as the base current $I_5$ into the base of the transistor Q11. That is, $I_5 = I_3 - I_{L3}$.

In this manner, the base current $I_5$ of the transistor Q11 flows only when the input voltage Vin falls into the window range 401. In other words, with a cut-off point of $I_3 = I_{L3}$, the transistor Q11 is kept off or non-conductive during the outside range 402 and becomes on or conductive during the window range 401. Therefore, a sharp comparator window can be obtained as shown in FIG. 14.

Figure 14:
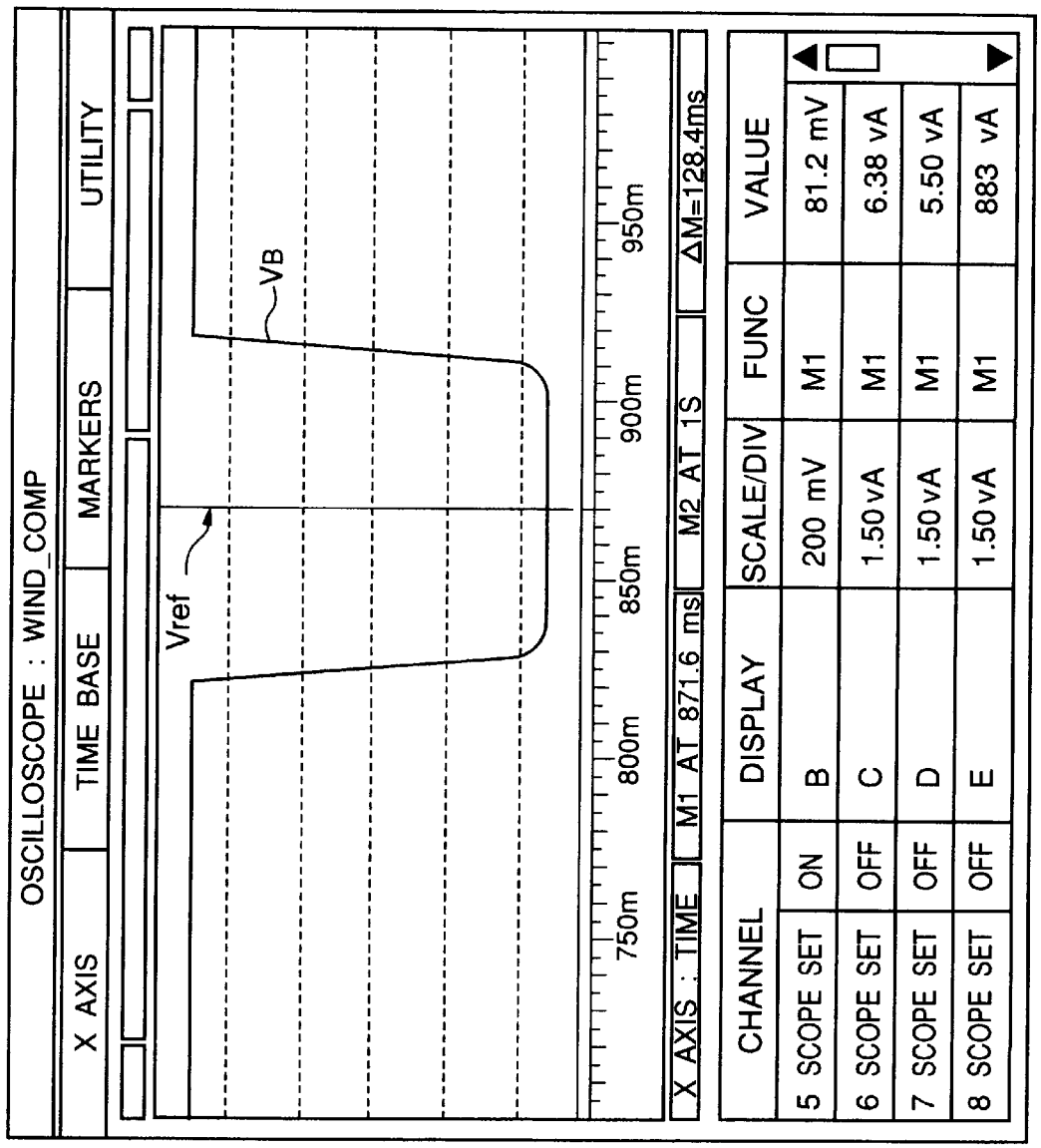
FIG. 14 is a diagram showing how the output voltages $V_B$ varies with the input voltage Vin in the third embodiment of FIG. 12.

FIG. 14 shows an input-output response of the embodiment in circuit simulation on condition that a:b=2:1, $I_{L1} = I_{L2} = I_L = 5$ $\mu$A, $I_{L3} = 5.5$ $\mu$A, Vref=0.87 V, Vcc=1.05 V, the resistor R1=100 K$\Omega$. It is apparent from the figure that the inverted output voltage $V_B$ sharply changes at the edges of the window range 401 to produce a sharp comparator window.

As described above, according to the present invention, a sharp comparator window can be obtained with simplified circuit arrangement. In other words, the window comparator can be formed with the reduced number of circuit elements and reduced power consumption. Therefore, it is suitable for circuit integration.

What is claimed is:

1. A circuit comprising:
   a first circuit stage comprising first and second unbalanced differential amplifiers for producing a first current from an input voltage and a reference voltage, the first current varying depending on the input voltage such that the first current has one of a maximum and a minimum when the input voltage is a predetermined voltage; and
   a second circuit stage for producing an output voltage from a reference current and a second current corresponding to the first current, the reference current and the second current being produced such that a voltage range is determined around the predetermined voltage depending on an amount that the second current is greater than the reference current, and the output voltage changing in level depending on whether the input voltage falls into the voltage range.

2. The circuit according to claim 1, wherein the second circuit stage comprises:
   a first current source for producing the second current from the first current;
   a second current source for producing the reference current from a mirror-image current which is obtained by reversing a magnitude of the first current; and
   a third current source for receiving the reference current and the second current to produce the output voltage.

3. The circuit according to claim 2, wherein
   the first current source comprises a first unbalanced current mirror circuit which receives the first current and produces the second current; and
   the second current source comprises a second unbalanced current mirror circuit which receives the mirror-image current and produces the reference current.

4. The circuit according to claim 1, wherein the second circuit stage comprises:
   a first current mirror circuit for producing a mirror current from a first current;
   a second current mirror circuit for producing the reference current from a mirror-image current which is obtained by reversing a magnitude of the first current; and
   an unbalanced current mirror circuit for producing the second current from the mirror current and the reference current and producing the output voltage.

5. The circuit according to claim 1, wherein the second circuit stage comprises:
   a current mirror circuit for producing a mirror current from the first current; and
   a constant current source for producing the reference current,
   wherein the current mirror circuit is connected to the constant current source such that the mirror current flows into the constant current source to produce the output voltage.

6. The circuit according to claim 1, further comprising:
   an inverter for inverting the output voltage to produce an inverted output voltage.

7. A circuit comprising:
   a differential circuit stage comprising first and second unbalanced differential amplifier each connected to a reference voltage and having an input port for receiving an input voltage, the differential circuit stage producing a pair of first and second differential currents from the input voltage and the reference voltage, the differential currents varying depending on the input voltage and forming a maximum and a minimum when the input voltage is a predetermined voltage;
   a current control stage for producing a reference current and a current corresponding to a selected one of the first and second differential currents such that a voltage range is determined around the predetermined voltage which range is varied depending on whether the current is greater than the reference current; and
   an output stage for producing an output voltage based on the reference current and the current, the output voltage changing in level depending on whether the input voltage falls into the voltage range.

8. The circuit according to claim 7, wherein the current control stage comprises:
   a first current source for producing the current which is greater than the first differential current by a first factor; and
   a second current source for producing the reference current which is greater than the second differential current by a second factor,
   wherein the first factor and the second factor are determined such that the voltage range is determined around the predetermined voltage depending on whether the current is greater than the reference current.

9. The circuit according to claim 8, wherein
   the first current source comprises a first unbalanced current mirror circuit which receives the first differential current and produces the current; and the second current source comprises a second unbalanced current mirror circuit which receives the second differential current and produces the reference current.

10. The circuit according to claim 7, wherein the current control stage and the output stage comprises:

a first current mirror circuit for producing a mirror current from the first differential current;

a second current mirror circuit for producing the reference current from the second differential current; and an unbalanced current mirror circuit for producing the current from the mirror current and the reference current and producing the output voltage.

11. The circuit according to claim 7, wherein the current control stage and the output stage comprises:

a current mirror circuit for producing a mirror current from the first differential current; and a constant current source for producing the reference current, wherein the current mirror circuit is connected to the constant current source such that the mirror current flows into the constant current source to produce the output voltage.

12. The circuit according to claim 7, further comprising:

an inverter for inverting the output voltage to produce an inverted output voltage.

13. The circuit according to claim 7, wherein the differential circuit stage comprises:

a first differential circuit comprising said first unbalanced differential amplifier for receiving the input voltage and the reference voltage and producing a first current and a second current which is smaller than the first current by a predetermined factor;

a second differential circuit comprising said second unbalanced differential amplifier for receiving the input voltage and the predetermined voltage and producing a third current and a fourth current which is smaller than the third current by the reference factor;

a first load current source connected to the first differential circuit, for producing a predetermined constant current; and a second load current source connected to the second differential circuit, for producing the predetermined constant current, wherein the first current and the third current are combined to produce the first differential current, and the second current and the fourth current are combined to produce the second differential current.

14. A method for forming a window of a window comparator comprising first and second unbalanced differential amplifiers, comprising the steps of:

producing a first current from an input voltage and a reference voltage, the first current varying depending on the input voltage such that the first current has one of a maximum and a minimum when the input voltage is a predetermined voltage;

producing a reference current and a second current corresponding to the first current such that the second current is partially greater or smaller than the reference current; and forming the window based on the second current and the reference current such that the window is determined around the predetermined voltage depending on whether the second current is greater than the reference current.

15. The method according to claim 14, wherein the reference current is produced from a mirror-image current which is obtained by reversing a magnitude of the first current.

16. The method according to claim 14, wherein the reference current is a constant current produced by a constant current source.

* * * * *

UNITED STATES PATENT AND TRADEMARK OFFICE
CERTIFICATE OF CORRECTION

PATENT NO. : 5,963,062
DATED : October 5, 1999
INVENTOR(S) : Tomohiro Fujii

It is certified that error appears in the above-identified patent and that said Letters Patent is hereby corrected as shown below:

Column 9, claim 13, line 10 should read--

--reference voltage-- and not "predetermined voltage", and line 12 should read -predetermined factor- and not "reference factor".

Signed and Sealed this

Twenty-third Day of January, 2001

Attest:

Q. TODD DICKINSON

Attesting Officer

Commissioner of Patents and Trademarks